United States Patent [19]

Ito et al.

[11] Patent Number: 4,870,701
[45] Date of Patent: Sep. 26, 1989

[54] CONNECTING STRUCTURE OF DIODES

[75] Inventors: Katsuo Ito, Kanazawa; Toichiro Sawabe, Ishikawa; Youji Maeda, Matsutou, all of Japan

[73] Assignee: Murata Manufacturing Co., Ltd., Kyoto, Japan

[21] Appl. No.: 131,718

[22] Filed: Dec. 11, 1987

[30] Foreign Application Priority Data

Dec. 11, 1986 [JP] Japan ................................ 61-295577

[51] Int. Cl.$^4$ .............................................. H04B 1/26
[52] U.S. Cl. ...................................... 455/326; 455/330
[58] Field of Search .............. 455/330, 333, 325, 326, 455/188, 323, 327

[56] References Cited

U.S. PATENT DOCUMENTS 4,186,352 1/1980 Hallford .............................. 455/330

Primary Examiner—Robert L. Griffin
Assistant Examiner—Curtis Kuntz
Attorney, Agent, or Firm—Wenderoth, Lind & Ponack

[57] ABSTRACT

A connecting structure of diodes in a double-balanced mixer for connecting the diodes on a substrate, which includes four diodes disposed in a row on one side face of a substrate, with the four diodes being arranged so that the diodes at the outer side in the row are directed in the same direction, while the diodes at the inner side in the row are directed also in the same direction to each other, and that the diodes at the outer side are directed in an opposite direction to the diodes at the inner side, and two rows of wiring patterns disposed on the substrate at one end side of each of the diodes in a direction generally intersecting the diodes, with alternate diodes of the four diodes being respectively connected to the corresponding wiring pattern.

4 Claims, 2 Drawing Sheets

CONNECTING STRUCTURE OF DIODES

BACKGROUND OF THE INVENTION

The present invention generally relates to an electric circuit construction, and more particularly, to a connecting structure of four diodes on a substrate in a double-balanced mixer employed, for example, in a CATV (cable television) tuner and the like.

Conventionally, in a double-balanced mixer as referred to above, it has been a practice to connect four diodes D1, D2, D3 and D4 in a bridge connection between ports PA and PB on a substrate (not shown) in an arrangement as shown, for example, in FIG. 5.

In the known arrangement as described above, however, since the diodes D2 and D4 inevitably intersect each other, either one of the diodes D2 or D4 must be disposed on the other side face (e.g., on the reverse side face) of the substrate, and therefore, there have been problems in that (1) due to the necessity for fixing the diodes on both side faces of the substrate, extra procedures are required to achieve the fixing, and (2) even if it is intended to subject the reverse side face of the substrate to immersion in solder, such treatment can not be effected since the diode on the reverse side face would be undesirably immersed in the solder.

SUMMARY OF THE INVENTION

Accordingly, an essential object of the present invention is to provide an improved connecting structure of diodes in a double-balanced mixer, which is capable of fixing all of the four diodes on one side face of a substrate.

Another important object of the present invention is to provide a connecting structure of diodes of the above described type, which is simple in construction and stable in functioning, and which can be readily manufactured on a large scale at low cost.

In accomplishing these and other objects, according to one preferred embodiment of the present invention, there is provided a connecting structure of diodes in a double-balanced mixer for connecting the diodes on a substrate, which includes four diodes disposed in a row on one side face of a substrate, said four diodes being so arranged that the diodes at the outer side in the row are directed in the same direction, with the diodes at the inner side in the row being directed also in the same direction to each other, and that the diodes at the outer side are directed in an opposite direction to the diodes at the inner side, and two rows of wiring patterns disposed on the substrate at one side of each of the diodes in a direction generally intersecting said diodes with alternate diodes of said four diodes being respectively connected to the corresponding wiring pattern.

By the arrangement according to the present invention as described above, an improved connecting structure of diodes has been advantageously presented through simple construction.

BRIEF DESCRIPTION OF THE DRAWINGS

These and other objects and features of the present invention will become clear from the following description taken in conjunction with the preferred embodiments thereof with reference to the accompanying drawings, in which.

DETAILED DESCRIPTION OF THE INVENTION

Figure 1:
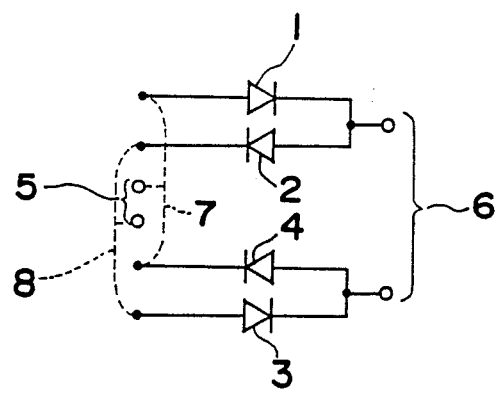
FIG. 1 is a schematic electric circuit diagram showing a connecting structure of diodes according to one preferred of the present invention.

Before the description of the present invention proceeds, it is to be noted that like parts are designated by like reference numerals throughout the accompanying drawings.

Referring now to the drawings, there is shown in FIG. 1 an electric circuit diagram schematically representing a connecting structure of diodes according to one preferred embodiment of the present invention. In this embodiment, four diodes 1, 2, 3 and 4 are disposed, for example, parallel to each other in a row as shown, on one side face (e.g., on a front face) of a substrate (not shown here, but as in a substrate 20 in FIG. 4), and these four diodes 1 to 4 are arranged so that the diodes 1 and 3 at the outer side in the row are directed in the same direction, with the diodes 2 and 4 at the inner side in the row being directed also in the same direction to each other, while the diodes 1 and 3 at the outer side are directed in an opposite direction to the diodes 2 and 4 at the inner side, and two rows of wiring patterns 7 and 8 are disposed, for example, on the reverse face of the substrate at one end side of each of the diodes 1 to 4 in a direction generally intersecting said diodes 1 to 4, with alternate diodes, e.g., diodes 1 and 4 being connected to the wiring pattern 7, and diodes 2 and 3 being connected to the wiring pattern 8, respectively. The wiring patterns 7 and 8 are connected to a port 5.

Figure 3:
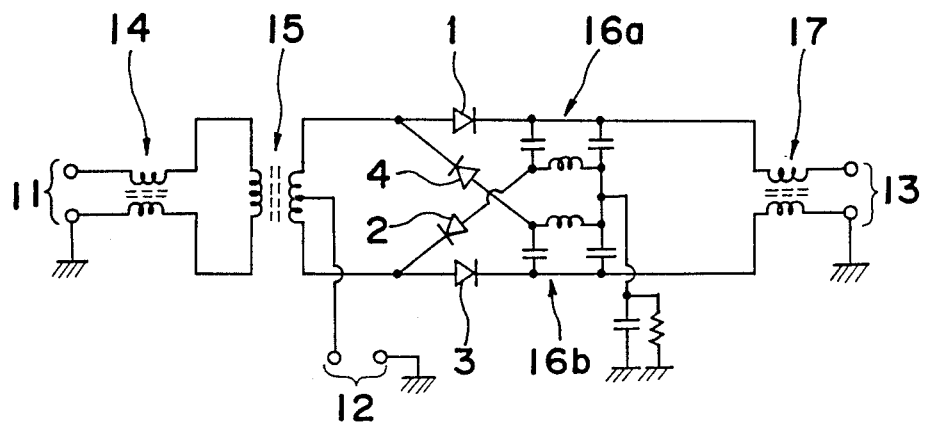
FIG. 3 is an electric circuit diagram showing a specific example of a double-balanced mixer.
Figure 4:
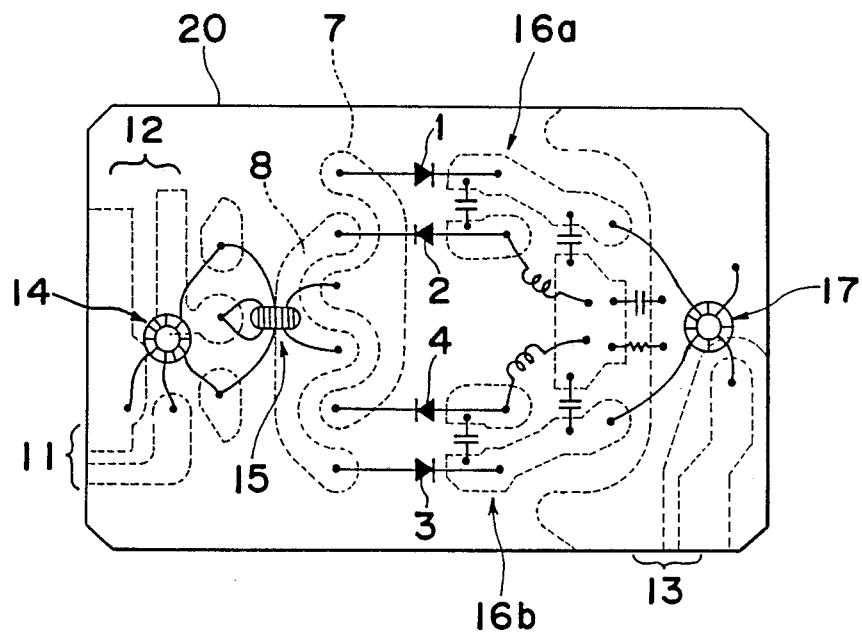
FIG. 4 is a schematic diagram showing a specific arrangement of the double-balanced mixer of FIG. 3 on a substrate.

At the side of a port 6, the diodes 1 and 2, and also the diodes 3 and 4 are respectively connected to each other by ordinary means, for example, directly as in this embodiment, or effectively through a capacitor or the like (FIGS. 3 and 4).

Figure 5:
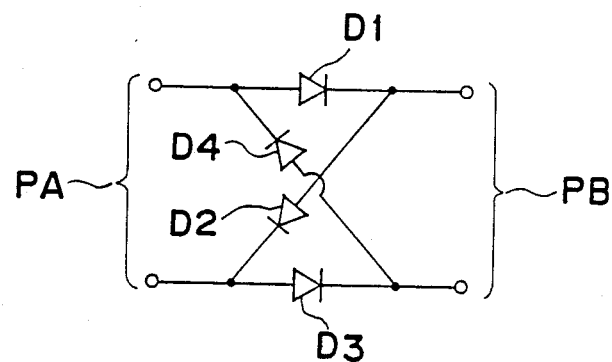
FIG. 5 is a schematic electric circuit diagram showing a conventional connecting structure of diodes (already referred to).

By the above embodiment in FIG. 1, the circuit construction becomes electrically equivalent to that of the conventional structure of FIG. 5 referred to earlier, and furthermore, the intersection of the diodes D2 and D4 in FIG. 5 is replaced by a cubic intersection between the diode 2 and the wiring pattern 7 in the arrangement of FIG. 1, and thus, it is possible to mount all of the four diodes 1 to 4 on one side face of the substrate.

Accordingly, due to one side face mounting, fixing of the diodes 1 to 4 is greatly facilitated, and since the undesirable solder immersion of the diode at the reverse face of the substrate as in the conventional arrangement can be prevented, it becomes possible to subject the reverse face of the substrate to the solder immersion for simplification of assembly of the mixer on the whole.

It should be noted here that the connecting structure in FIG. 1 may be so modified that the wiring pattern 8 is disposed to the side close to the diodes 1 to 4, with the wiring pattern 7 being disposed at the outer side thereof to obtain substantially the same effect.

Figure 2:
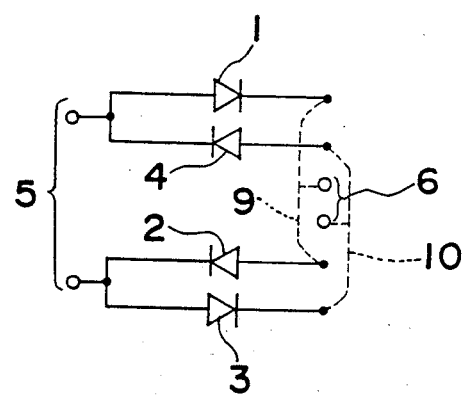
FIG. 2 is a diagram similar to FIG. 1, which particularly shows a modification thereof.

Referring to FIG. 2, there is shown a modification of a connecting structure of FIG. 1. In this modified connecting structure in FIG. 2, the four diodes 1 to 4 are so arranged that the diodes 1 and 3 at the outer side in the row are directed in the same direction, with the diodes 4 and 2 at the inner side in the row also being directed in the same direction to each other, while the diodes 1 and 3 at the outer side are directed in an opposite direction to the diodes 4 and 2 at the inner side in the similar manner as in FIG. 1, but two rows of wiring patterns 9 and 10 are disposed at the side of the port 6, with alternate diodes, e.g., diodes 1 and 2 being connected to the wiring pattern 9, and diodes 4 and 3 being connected to the wiring pattern 10, respectively. The wiring patterns 9 and 10 are connected to the port 6.

At the side of port 5, the diodes 1 and 4, and also the diodes 2 and 3 are respectively connected to each other by ordinary means. In the modification of FIG. 2, it may also be so modified such that the wiring pattern 10 is disposed to the side close to the diodes 1 to 4, with the wiring pattern 9 being disposed at the outer side thereof to obtain substantially the same effect.

The circuit construction of FIG. 2 is also electrically equivalent to that of the conventional circuit construction of FIG. 5, and moreover, since all of the diodes 1 to 4 can be mounted on one side face of the substrate, a similar effect as in the embodiment of FIG. 1 may be obtained.

Referring also to FIG. 3, there is shown an electric circuit diagram showing a specific example of a double-balanced mixer to which the connecting structure according to the present invention may be applied. The double-balanced mixer in FIG. 3 generally includes a phase distributor 15 composed of a transmission line transformer, and phase distributors 16a and 16b constituted by LC circuits, and four diodes 1 to 4 effectively connected in the bridge connection between the phase distributor 15 and the phase distributors 16a and 16b, which are coupled to an RF port 11 and an IF port 13 through corresponding input and output transmission lines 14 and 17, and also to an LO port 12 as shown.

A high frequency signal supplied to the RF port 11 is subjected to frequency conversion based on a local oscillation signal fed to the LO port 12, by the phase distributors 15, 16a and 16b, and the diodes 1 to 4, and thus, an intermediate frequency signal is produced from the IF port 13.

FIG. 4 is a schematic diagram showing a specific example of an arrangement of the double-balanced mixer of FIG. 3 on the substrate. In the arrangement of FIG. 4, the parts as referred to above are disposed on the upper surface of the substrate 20, while the wiring patterns 7 and 8 and other wiring patterns are disposed on the under surface of said substrate 20 as shown by the dotted lines. In the example of FIG. 4, the connecting structure as explained with reference to FIG. 1 is employed, and the one end side of each of the diodes 1 to 4 is connected to the phase distributor 15 through the wiring patterns 7 and 8 as described earlier.

As is clear from the foregoing description, according to the connecting structure of the present invention, since all of the four diodes can be mounted on one side face of the substrate, the attaching of such diodes is greatly facilitated, while it becomes possible to subject the other side face to immersion in solder, and thus, simplification in the assembling of the mixer can be achieved.

Although the present invention has been fully described in connection with the preferred embodiments thereof with reference to the accompanying drawings, it is to be noted that various changes and modifications are apparent to those skilled in the art. Such changes and modifications are to be understood as included within the scope of the present invention as defined by the appended claims unless they depart therefrom.

What is claimed is:

1. A connecting structure of diodes in a double-balanced mixer on a substrate comprising:
    a first diode, a second diode, a third diode, and a fourth diode disposed in a row and extending parallel to each other on one side of said substrate, said four diodes each having a pair of lead wires, each of said lead wires having a first portion extending along a surface of said one side of said substrate and a second portion extending through said substrate from said one side of said substrate to the other side of said substrate, said first and fourth diodes directed in a first direction and said second and third diodes directed in a second direction opposite said first direction, the length of said first portion of each of said lead wires being substantially the same;
    a first wiring pattern disposed on said other side of said substrate connecting adjacent second portions of said lead wires of said first and third diodes, said second portions of said lead wires of said first and third diodes connected with said first wiring pattern extending through said substrate at first and third locations on said substrate; and,
    a second wiring pattern disposed on said other side of said substrate connecting adjacent second portions of said lead wires of said second and fourth diodes, said second portions of said lead wires of said second and fourth diodes connected with said second wiring pattern extending through said substrate at second and fourth locations on said substrate.

2. A connecting structure as claimed in claim 1, further comprising:
    a phase distributor having a plurality of lead wires disposed on said one side of said substrate, said phase distributor having one lead wire extending through said substrate at a fifth location on said substrate and connecting with said first wiring pattern, and having a second lead wire extending through said substrate at a sixth location and connecting with said second wiring pattern.

3. A connecting structure as claimed in claim 2, wherein said first through sixth locations are arranged in a straight line.

4. A connecting structure as claimed in claim 2, wherein said first through sixth locations are arranged in a straight line and wherein said first through sixth locations have substantially equal distances therebetween.

* * * * *